United States Patent
Babayan et al.

(10) Patent No.: US 10,954,594 B2
(45) Date of Patent: Mar. 23, 2021

(54) HIGH TEMPERATURE VAPOR DELIVERY SYSTEM AND METHOD

(71) Applicant: Applied Materials, Inc., Santa Clara, CA (US)

(72) Inventors: Viachslav Babayan, Sunnyvale, CA (US); Qiwei Liang, Fremont, CA (US); Tobin Kaufman-Osborn, Sunnyvale, CA (US); Ludovic Godet, Sunnyvale, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1297 days.

(21) Appl. No.: 14/957,440

(22) Filed: Dec. 2, 2015

(65) Prior Publication Data
US 2017/0088949 A1   Mar. 30, 2017

Related U.S. Application Data

(60) Provisional application No. 62/235,130, filed on Sep. 30, 2015.

(51) Int. Cl.
*C23C 16/448* (2006.01)
*C23C 16/44* (2006.01)
(Continued)

(52) U.S. Cl.
CPC ...... *C23C 16/4485* (2013.01); *C23C 16/4401* (2013.01); *C23C 16/4411* (2013.01);
(Continued)

(58) Field of Classification Search
CPC ............... C23C 14/24; C23C 16/4485; C23C 16/45517; C23C 16/4401; C23C 16/46;
(Continued)

(56) References Cited

U.S. PATENT DOCUMENTS 3,260,235 A * 7/1966 Witz ............... C23C 14/22
                                                   118/69
4,563,262 A * 1/1986 Sablev ............ C23C 14/325
                                                  204/192.38
(Continued)

FOREIGN PATENT DOCUMENTS

JP    H07273052 A   10/1995
JP    2003027218 A   1/2003
(Continued)

OTHER PUBLICATIONS

Taiwanese Office Action (with attached English translation of the Search Report) for Application No. 105127638; dated May 15, 2019; 6 total pages.
(Continued)

*Primary Examiner* — Aiden Lee
(74) *Attorney, Agent, or Firm* — Patterson + Sheridan, LLP

(57) ABSTRACT

The present disclosure generally relate to a semiconductor processing apparatus. In one embodiment, a processing chamber is disclosed herein. The processing chamber includes a chamber body and lid defining an interior volume, the lid configured to support a housing having a cap, a substrate support disposed in the interior volume, a vaporizer coupled to the cap and having an outlet open to the interior volume of the processing chamber, wherein the vaporizer is configured to deliver a precursor gas to a processing region defined between the vaporizer and the substrate support, and a heater disposed adjacent to the vaporizer, wherein the heater is configured to heat the vaporizer.

19 Claims, 5 Drawing Sheets

(51) Int. Cl.
*C23C 16/458* (2006.01)
*C23C 16/46* (2006.01)
*H01L 21/687* (2006.01)
*H01L 21/67* (2006.01)
*H01L 21/677* (2006.01)
*C23C 16/455* (2006.01)

(52) U.S. Cl.
CPC .... *C23C 16/4586* (2013.01); *C23C 16/45517* (2013.01); *C23C 16/46* (2013.01); *H01L 21/6719* (2013.01); *H01L 21/67109* (2013.01); *H01L 21/67115* (2013.01); *H01L 21/67742* (2013.01); *H01L 21/67754* (2013.01); *H01L 21/68707* (2013.01); *H01L 21/68764* (2013.01); *H01L 21/68771* (2013.01)

(58) Field of Classification Search
CPC ............. C23C 16/4586; C23C 16/4411; C23C 16/448; H01L 21/6719; H01L 21/68764; H01L 21/67109; H01L 21/67742; H01L 21/67754; H01L 21/67115; H01L 21/68707; H01L 21/68771
USPC ........................................................ 118/726
See application file for complete search history.

(56) References Cited

U.S. PATENT DOCUMENTS

| | | | |
|---|---|---|---|
| 4,791,273 A | 12/1988 | Satoh et al. | |
| 5,009,738 A * | 4/1991 | Gruenwald | H01J 37/3244 156/345.47 |
| 5,674,574 A | 10/1997 | Atwell et al. | |
| 5,968,594 A * | 10/1999 | Hu | C23C 16/448 427/248.1 |
| 6,258,170 B1 | 7/2001 | Somekh et al. | |
| 6,280,793 B1 | 8/2001 | Atwell et al. | |
| 6,512,885 B1 * | 1/2003 | Yamamuka | C23C 16/4481 118/724 |
| 6,593,580 B2 | 7/2003 | Miyabayashi | |
| 7,009,281 B2 * | 3/2006 | Bailey, III | H01J 37/32522 156/345.24 |
| 7,112,804 B2 | 9/2006 | Horsky et al. | |
| 7,326,937 B2 | 2/2008 | Mehta et al. | |
| 7,695,233 B2 * | 4/2010 | Toshima | H01L 21/67201 156/345.23 |
| 7,699,932 B2 * | 4/2010 | Miller | C23C 16/45544 118/715 |
| 2002/0185069 A1 * | 12/2002 | Hoffmann | C23C 14/12 118/726 |
| 2004/0007180 A1 * | 1/2004 | Yamasaki | C23C 16/16 118/715 |
| 2007/0254100 A1 * | 11/2007 | Nijhawan | C23C 16/303 427/248.1 |
| 2008/0241381 A1 | 10/2008 | Suzuki | |
| 2010/0255181 A1 * | 10/2010 | Hopper | C23C 16/4485 427/8 |

FOREIGN PATENT DOCUMENTS

| | | |
|---|---|---|
| JP | 2007520059 A | 7/2007 |
| JP | 2007242648 A | 9/2007 |
| JP | 2013064200 A | 4/2013 |
| TW | 500823 B | 9/2002 |
| TW | 201202470 A | 1/2012 |
| TW | 201511136 A | 3/2015 |

OTHER PUBLICATIONS

Office Action for Japanese Patent Application No. 2016-187671 dated Sep. 1, 2020.
Office Action for Taiwan Patent Application No. 109113153 dated Dec. 11, 2020.

* cited by examiner

HIGH TEMPERATURE VAPOR DELIVERY SYSTEM AND METHOD

CROSS-REFERENCE TO RELATED APPLICATIONS

This application claims priority from U.S. Provisional Application Ser. No. 62/235,130, filed Sep. 30, 2015, which is hereby incorporated by reference in its entirety.

BACKGROUND

Field

Embodiments of the present disclosure generally relate to a semiconductor processing apparatus, and more particularly to an apparatus for delivering precursors with high boiling temperatures.

Description of the Related Art

Reliably producing sub-half micron and smaller features is one of the key technology challenges for next generation very large scale integration (VLSI) and ultra large scale integration (ULSI) of semiconductor devices. However, as the limits of circuit technology are pushed, the shrinking dimensions of VLSI and ULSI technology have placed additional demands on processing capabilities. Reliable formation of gate structures on the substrate is important to VLSI and ULSI success and to the continued effort to increase circuit density.

As circuit densities increase for next generation devices, the widths of interconnects, such as vias, trenches, contacts, gate structures and other features, as well as the dielectric materials therebetween, decrease to 45 nm and 32 nm dimensions and beyond. In order to enable the fabrication of next generation devices and structures, three dimensional (3D) stacking of features in semiconductor chips is often utilized. In particular, fin field effect transistors (FinFETs) are often utilized to form three dimensional (3D) structures in semiconductor chips. By arranging transistors in three dimensions instead of conventional two dimensions, multiple transistors may be placed in the integrated circuits (ICs) very close to each other. As circuit densities and stacking increase, the ability to selectively deposit subsequent materials on previously deposited materials gains importance.

Thus, there is a need for improved apparatus for selective deposition suitable for three dimensional (3D) stacking of semiconductor chips or other semiconductor devices.

SUMMARY

In one embodiment, a processing chamber is disclosed herein. The processing chamber includes a chamber body and lid defining an interior volume, the lid configured to support a housing having a cap, a substrate support disposed in the interior volume, a vaporizer coupled to the cap of the processing chamber within the interior volume of the processing chamber, wherein the vaporizer is configured to deliver a precursor gas to a processing region defined between the vaporizer and the substrate support, and a heater disposed adjacent to the vaporizer, wherein the heater is configured to heat the vaporizer.

In another embodiment, a processing chamber is disclosed herein. The processing chamber includes a chamber body and lid defining an interior volume, wherein the lid is configured to support a housing having a cap, and wherein the cap includes a water cooled base plate to control a temperature of the cap, a substrate support assembly disposed in the interior volume, a vaporizer coupled to the cap of the processing chamber within the interior volume by a thermal isolator, wherein the vaporizer is configured to deliver a precursor to a processing region defined between the vaporizer and the substrate support assembly, and a heater disposed adjacent to the vaporizer, wherein the heater is configured to heat the vaporizer to a temperature between 100° C. and 600° C.

In one embodiment, a substrate processing platform for processing a plurality of substrates is disclosed herein. The substrate processing platform includes a rotary track mechanism, a plurality of processing chambers, and a transfer robot. The plurality of processing chambers is disposed in an array about the rotary track mechanism. One processing chamber includes a chamber body and lid defining an interior volume, the lid configured to support a housing having a cap, a substrate support disposed in the interior volume, a vaporizer coupled to the cap of the processing chamber within the interior volume of the processing chamber, wherein the vaporizer is configured to deliver a precursor gas to a processing region defined between the vaporizer and the substrate support, and a heater disposed adjacent to the vaporizer, wherein the heater is configured to heat the vaporizer. The transfer robot is configured to carry a plurality of substrates and concurrently transfer the substrates into and out of the substrate processing platform.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this disclosure and are therefore not to be considered limiting of its scope, for the disclosure may admit to other equally effective embodiments.

DETAILED DESCRIPTION

Figure 1:
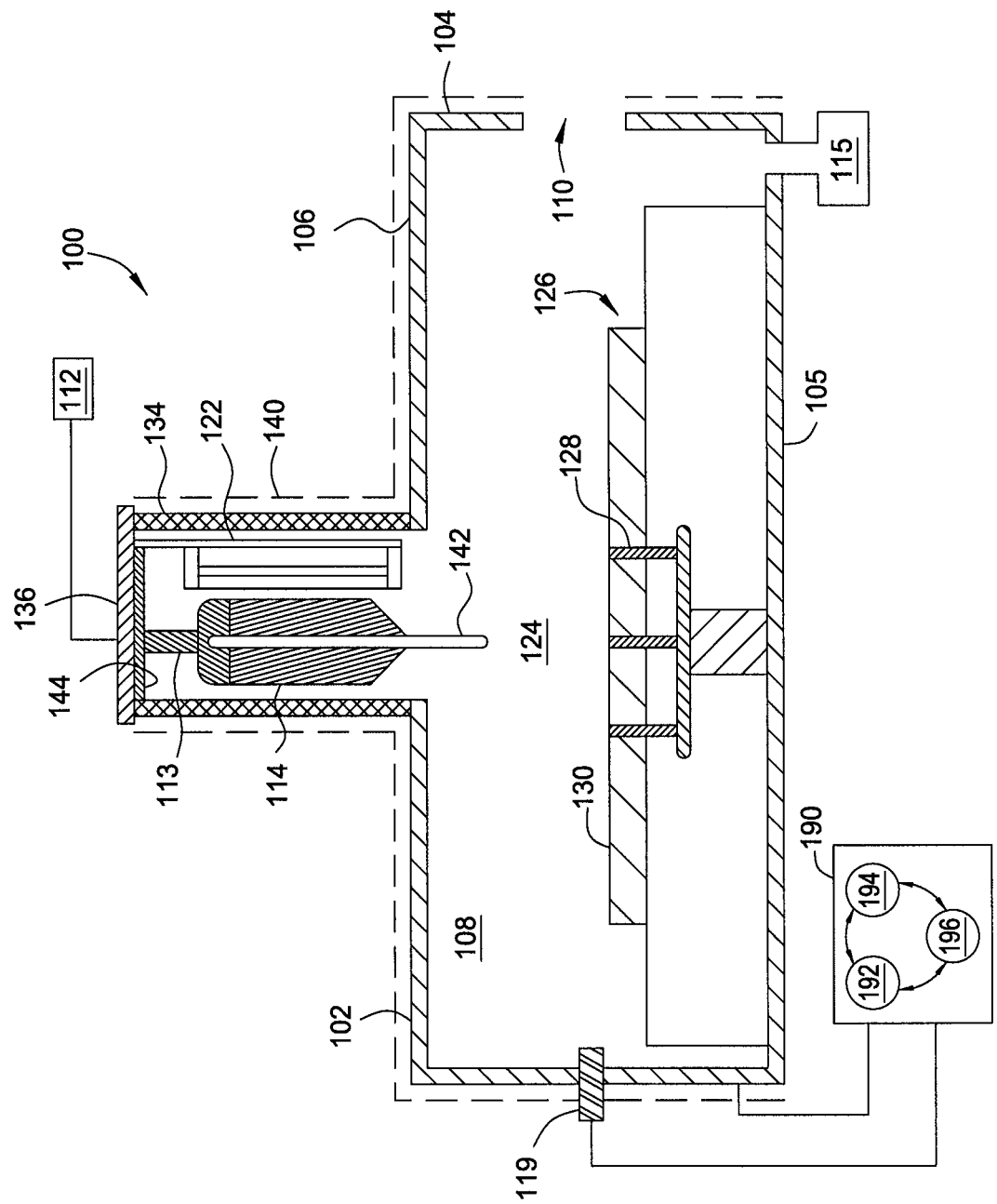
FIG. 1 illustrates a processing chamber having heated sidewalls and a vaporizer mounted above a substrate, according to one embodiment.

FIG. 1 illustrates a processing chamber 100, according to one embodiment. For example, the processing chamber 100 may be a chemical vapor deposition (CVD) chamber, or any processing chamber that delivers precursors with high boiling points and low vapor pressures. The processing chamber 100 includes a chamber body 102 having sidewalls 104, a bottom 105, and a lid 106. The sidewalls 104 and lid 106 define an interior volume 108. In one embodiment, the sidewalls 104 and lid 106 are heated. For example, the sidewalls 104 and lid 106 may be heated to a temperature of 250° Celsius (C), while a substrate support assembly 126 may be heated to 220° C. In one embodiment, the substrate support assembly 126 may be a heated substrate support assembly. For example, the substrate support assembly 126 may be heated to a temperature of about 190° C., or about 20°-30° C. lower than the sidewalls 104. An external heat shield 140 may be positioned around the chamber body 102 to protect users from the heated sidewalls 104 and lid 106. A substrate transfer port 110 is formed in the sidewall 104 for transferring substrates into and out of the interior volume 108.

A precursor delivery system 112 is coupled to the processing chamber 100 to supply a precursor material into the interior volume 108. In one embodiment, the precursor may include octadecylphosphonic acid (ODPA), tungsten hexachloride, dodecanethiol, and the like. An exhaust port 115 may be coupled to the processing chamber 100 in communication with the interior volume 108 to control the pressure in the interior volume 108. The gas pressure within the processing chamber 100 may be monitored by a pressure sensor 119. For example, in one embodiment, the pressure of the processing chamber 100 is maintained at a pressure between 1 mtorr to 200 torr.

A substrate support assembly 126 is disposed within the interior volume 108 of the processing chamber 100. The substrate support assembly 126 is configured to support a substrate (not shown) during processing. The substrate support assembly 126 includes a plurality of lift pins 128 movably disposed therethrough. The lift pins 128 may be actuated to project from a support surface 130 of the substrate support assembly 126, thereby placing the substrate in a spaced-apart relation to the substrate support assembly 126 to facilitate transfer with a transfer robot (not shown).

The lid 106 is configured to support a housing 134. The housing 134 includes a cap 136 disposed opposite the lid 106, and encloses the vaporizer 114. The vaporizer may suspend from the cap 136 or be coupled to another portion of the housing 134. The vaporizer 114 includes an outlet port 142 that is directly open to the interior volume 108. The vaporizer 114 is configured to convert precursors supplied by the precursor delivery system 112 to a vapor to be supplied to a processing region 124 defined between the substrate support assembly 126 and the vaporizer 114. The precursors may be solid or liquid at room temperature. A thermal isolator 113 may be placed between the cap 136 and the vaporizer 114 to protect the cap 136 from overheating. A heating element 122 is positioned within the housing 134 adjacent to the vaporizer 114. In one embodiment, the heating element 122 is supported by the cap 136 or housing 134. The heating element 122 is configured to heat the precursor inside the vaporizer 114. The heating element 122 may be, for example, a lamp, a light emitting diode, a laser, a resistive heater, or any suitable heater. In one embodiment, the heating element 122 heats the vaporizer 114 such that the precursor reaches a temperature between 100° C. and 600° C. The cap 136 may include a water cooled base plate 144 configured to help control the temperature of the cap 136 and housing 134.

A controller 190 is coupled to the processing chamber 100. The controller 190 includes a central processing unit (CPU) 192, a memory 194, and support circuits 196. The controller 190 is utilized to control a rate of gas supplied by the vaporizer 114 to the processing region 124 and the temperatures of the sidewalls 104, bottom 105, and substrate support assembly 126. Maintaining a substrate support assembly 126 temperature to be less than the vaporizer 114 temperature aids in reducing the deposition on the sidewalls 104 of the chamber body 102. The CPU 192 may be of any form of a general purpose computer processor that can be used in an industrial setting. The software routines can be stored in the memory 194, such as random access memory, read only memory, floppy or hard disk drive, or other form of digital storage. The support circuits 196 are conventionally coupled to the CPU 192 and may comprise cache, clock circuits, input/output subsystems, power supplies, and the like. The software routines, when executed by the CPU 192, transform the CPU 192 into a specific purpose computer (controller) 190 that controls the processing chamber 100 such that the processes are performed in accordance with the present disclosure. The software routines may also be stored and/or executed by a second controller (not shown) that is located remotely from the chamber.

The controller 190 may be representative of a control system that includes a plurality of controllers. For example, the controller 190 may include a heater controller, a multichannel heater controller, and a main controller. The heater controller is configured to power the heating elements of the vaporizer 114. The multichannel heater controller is configured to heat the sidewalls 104, the lid 106, the substrate support assembly 126, and internal heat shield (shown in FIG. 2). The main controller is configured to regulate chamber 100 pressure by varying the temperature of the vaporizer 114 and the exhaust port 115 position. The main controller also provides set points to the multichannel heater controller based on user input and recipe parameters.

Figure 2:
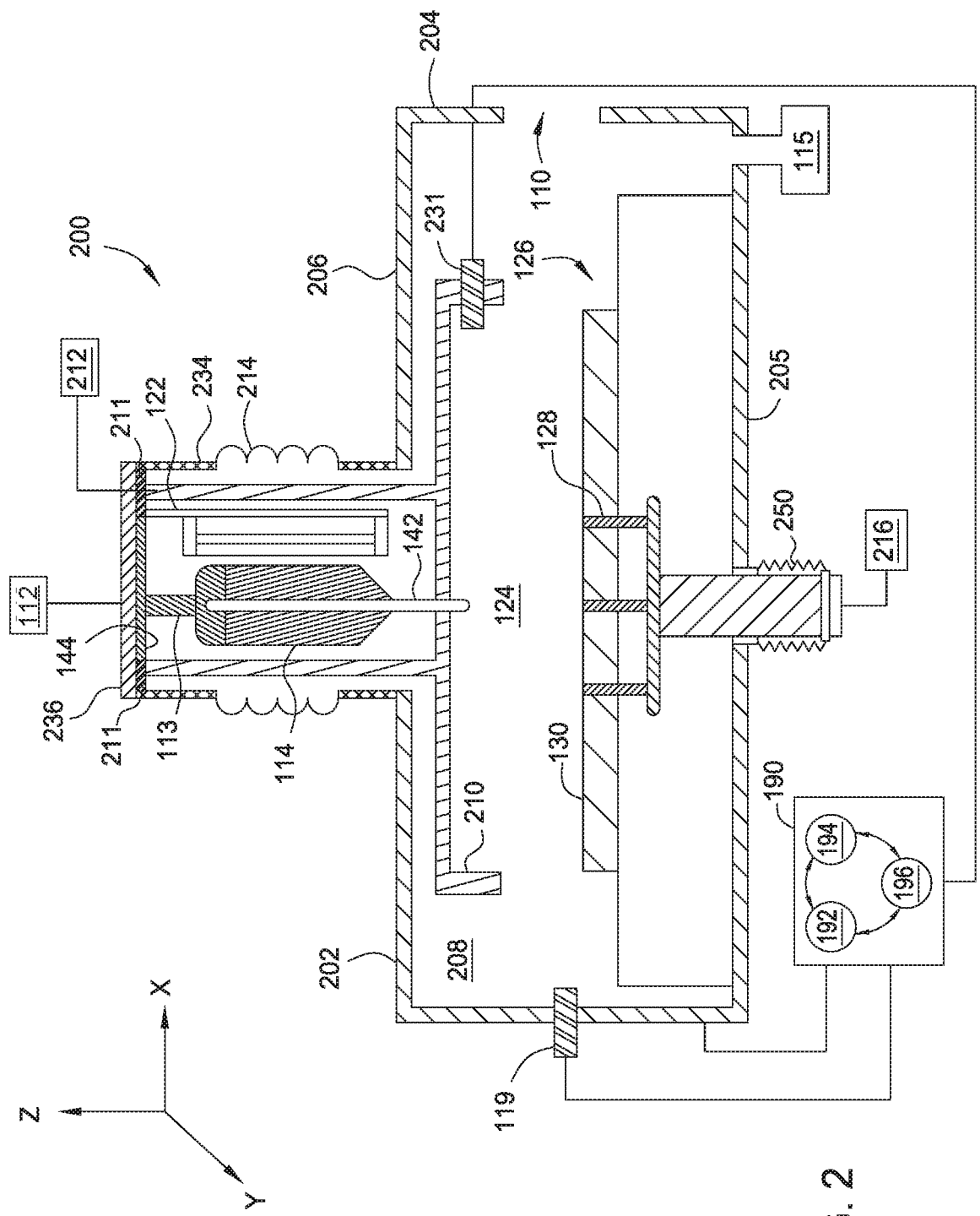
FIG. 2 illustrates a processing chamber having a vaporizer and an internal heat shield, according to one embodiment.

FIG. 2 illustrates processing chamber 200, according to another embodiment. The processing chamber 200 is substantially similar to the processing chamber 100. The processing chamber 200 includes a chamber body 202 having sidewalls 204, a bottom 205, and a lid 206. The sidewalls 204, lid 206, and bottom 205 define an interior volume 208. In one embodiment, the sidewalls 204 and lid 206 are water cooled chamber walls. The water cooled chamber sidewalls 204 and lid 206 aid in controlling the temperature of the chamber body 202.

The lid 206 is configured to support a housing 234. The housing 234 includes a cap 236 disposed opposite the lid 206, and encloses the vaporizer 114. The vaporizer 114 may suspend from the cap 236 or be coupled to another portion of the housing 234. An internal heat shield 210 is mounted to the cap 236 or housing 234 within the interior volume 208. Thermal isolators 211 are positioned between the internal heat shield 210 and the cap 236 or housing 234. The internal heat shield 210 is spaced from the chamber body 202. The internal heat shield 210 at least partially surrounds the vaporizer 114. The internal heat shield 210 may be heated in lieu of heating the sidewalls 204 and lid 206 of the chamber body 202 to a high temperature. The internal heat shield 210 prevents unintended condensation on the chamber body 202 and eliminates the need for an external heat shield (such as external heat shield 140 in FIG. 1), and also eliminates the need for heating chamber walls and lid, resulting in an energy efficient system. In one embodiment, the internal heat shield 210 includes an internal pressure sensor 231 that is configured to measure the gas pressure within the volume of the internal heat shield 210, while the pressure sensor 119 monitors the pressure of the processing chamber 200 outside the internal heat shield 210.

The vaporizer 114 includes an outlet port 142 that extends through the internal heat shield 210. The outlet port 142 is open to the space within of the processing region 124 between the heat shield 210 and substrate disposed on the support surface 130 of the substrate support assembly 126. In another embodiment, a showerhead (not shown) may be integrated into the internal heat shield 210 for uniform vapor distribution. The outlet port 142 would open into a plenum (not shown) in the showerhead. The showerhead would be heated to the same temperature as the heat shield.

In one embodiment, the processing chamber 200 further includes a first actuator 212 coupled to the cap 236. The cap 236 is coupled to the housing 234 by a bellows 214. The bellows 214 allow the actuator 212 to move the cap 236 in the z-direction while maintaining vacuum within the interior volume 208 of the processing chamber 200. Moving the cap 236 in the z-direction raises and lowers the internal heat shield 210 and the vaporizer 114 coupled to the cap 236. Lowering the internal heat shield 210 reduces the spacing within of the processing region 124 between the substrate and internal heat shield 210, and confines the process gases directly above the substrate. This results in an efficient process material and energy utilization of the process gases. In one embodiment, the internal heat shield 210 may include an oring (not shown) at the base of the internal heat shield 210. The oring allows for a cavity above the substrate to be pressurized to a higher pressure than the base pressure of the processing chamber 200, resulting in an efficient process material utilization. This is measured by the internal pressure sensor 231 positioned within the internal heat shield 210.

In another embodiment, the processing chamber 200 may include a second actuator 216 coupled to the substrate support assembly 126. The second actuator 216 is configured to move the substrate support assembly 126 in the z-direction. Moving the substrate support assembly 126 in the upwards z-direction positions the substrate support assembly 126 closer to the internal heat shield 210 such that the processing region 124 is confined, similar to having the actuator 212 lower the internal heat shield 210. A bellows 250 is coupled to the bottom 205 of the chamber body 202 to maintain vacuum when the actuator 216 moves the substrate support assembly 126.

Figure 3:
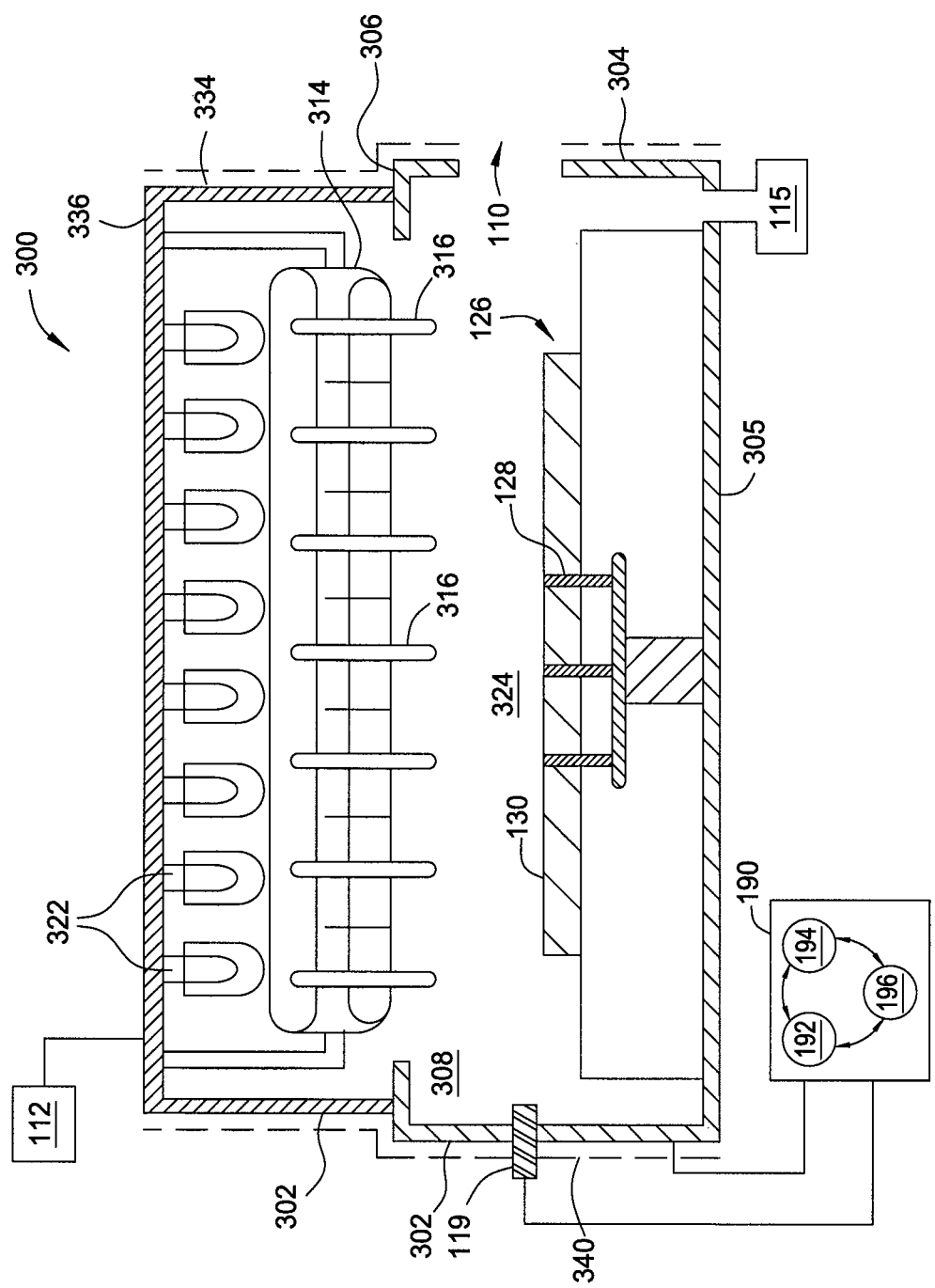
FIG. 3 illustrates a processing chamber having heated side walls and a multi-nozzle vaporizer, according to one embodiment.

FIG. 3 illustrates another embodiment of a processing chamber 300. The processing chamber 300 is substantially similar to processing chambers 200 and 100. The processing chamber 300 includes a chamber body 302 having sidewalls 304, a bottom 305, and a lid 306. The sidewalls 304, lid 306, and bottom 305 define an interior volume 308. In one embodiment, the sidewalls 304 and lid 306 are heated. For example, the sidewalls 304 and lid 306 may be heated to a temperature of 250° C. An external heat shield 340 may be positioned around the chamber body 302 to protect users from the heated sidewalls 304 and lid 306. In another embodiment, an internal heat shield, similar to internal heat shield 210, may be used in lieu of heating the sidewalls 304 and lid 306.

The lid 306 is configured to support a housing 334. The housing 334 includes a cap 336 disposed opposite the lid 306, and encloses the vaporizer 314. The vaporizer 314 may suspend from the cap 336 or be coupled to another portion of the housing 334. The vaporizer 314 includes a plurality of outlet ports 316 that is directly open to the interior volume 308. The vaporizer 314 is configured to convert the precursor supplied by the precursor delivery system 112 to a vapor to be supplied to a processing region 324 defined between the substrate support assembly 126 and the vaporizer 114. The plurality of outlets 316 allow for a uniform flow of vapor to be distributed to the substrate. A plurality of heating elements 322 are positioned adjacent to the vaporizer 314. In one embodiment, the heating elements 322 are mounted to the cap 336, between the cap 336 and the vaporizer 314. The heating elements 322 are configured to heat the precursor inside the vaporizer 314. The heating elements 322 may be, for example, a lamp, a light emitting diode, a laser, a resistive heater, or any suitable heating elements. In one embodiment, the heating elements 322 heat the vaporizer 314 such that the precursor reaches a temperature between 100° C. and 600° C. The plurality of heating elements 322 and the plurality of outlets 316 allow for different processing zones across a surface of the substrate.

Figure 4:
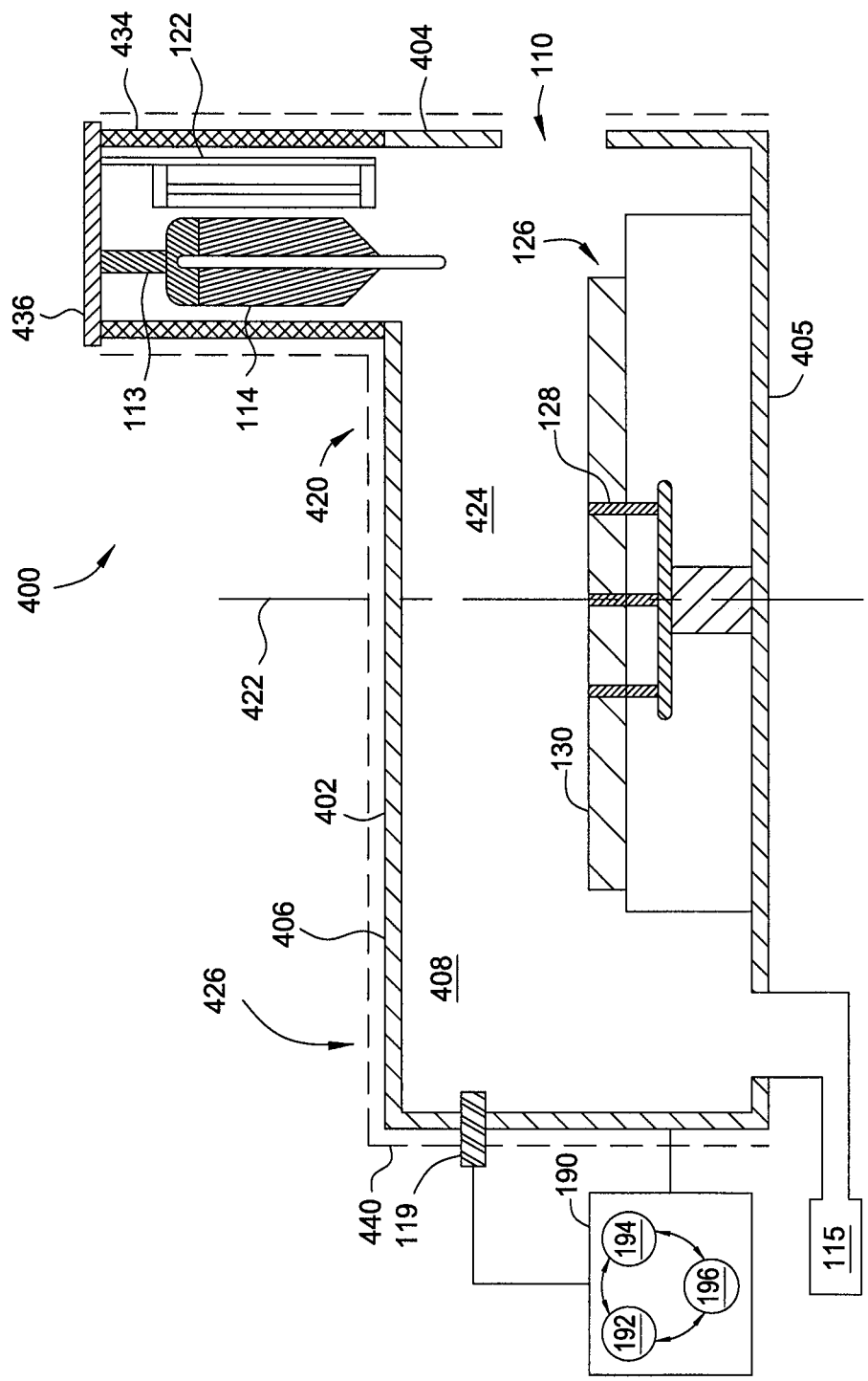
FIG. 4 illustrates a processing chamber with a cross-flow configuration, according to one embodiment.

FIG. 4 illustrates a processing chamber 400, according to another embodiment. The processing chamber 400 is substantially similar to processing chamber 100. The processing chamber 400 includes a chamber body 402 having sidewalls 404, a bottom 405, and a lid 406. The sidewalls 404, lid 406, and bottom 405 define an interior volume 408. In one embodiment, the sidewalls 404 and lid 406 are heated. For example, the sidewalls 404 and lid 406 may be heated to a temperature of 250° C. An external heat shield 440 may be positioned around the chamber body 402 to protect users from the heated sidewalls 404 and lid 406. A substrate transfer port 110 is formed in the sidewall 404 for transferring substrates into and out of the interior volume 408.

The lid 406 is configured to support a housing 434. The housing 434 includes a cap 436 disposed opposite the lid 406, and encloses the vaporizer 114. The vaporizer 114 may suspend from the cap 436 or be coupled to another portion of the housing 434. The vaporizer 114 includes an outlet port 142 that is directly open to the interior volume 408. The lid 406 supports the housing at a first side 420 of a centerline 422 of the substrate support assembly 126. Thus, the vaporizer 114 is coupled to the cap 436 at the first side 420 of the centerline 422 of the substrate support assembly 126. The exhaust port 115 is positioned at a second side 426 of the centerline 422, opposite the first side 420. The positioning of the vaporizer 114 and the exhaust port 115 at opposite sides of the centerline 422 allows for a cross-flow of vapor across the surface of the substrate (not shown) in a processing region 424.

Alternatively, in another embodiment, the housing 434 may be supported horizontally by the sidewall 404 to provide a cross-flow of vapor across the surface of the substrate. The vaporizer 114 is positioned on the sidewall 404 at a first side 420 of a centerline 422 of the substrate support assembly 126.

In another embodiment, the chamber 400 may include a vertical chamber configuration, wherein the substrate is mounted vertically on a vertical substrate support assembly, and gas flows from the top to the bottom across the surface of the substrate.

Figure 5:
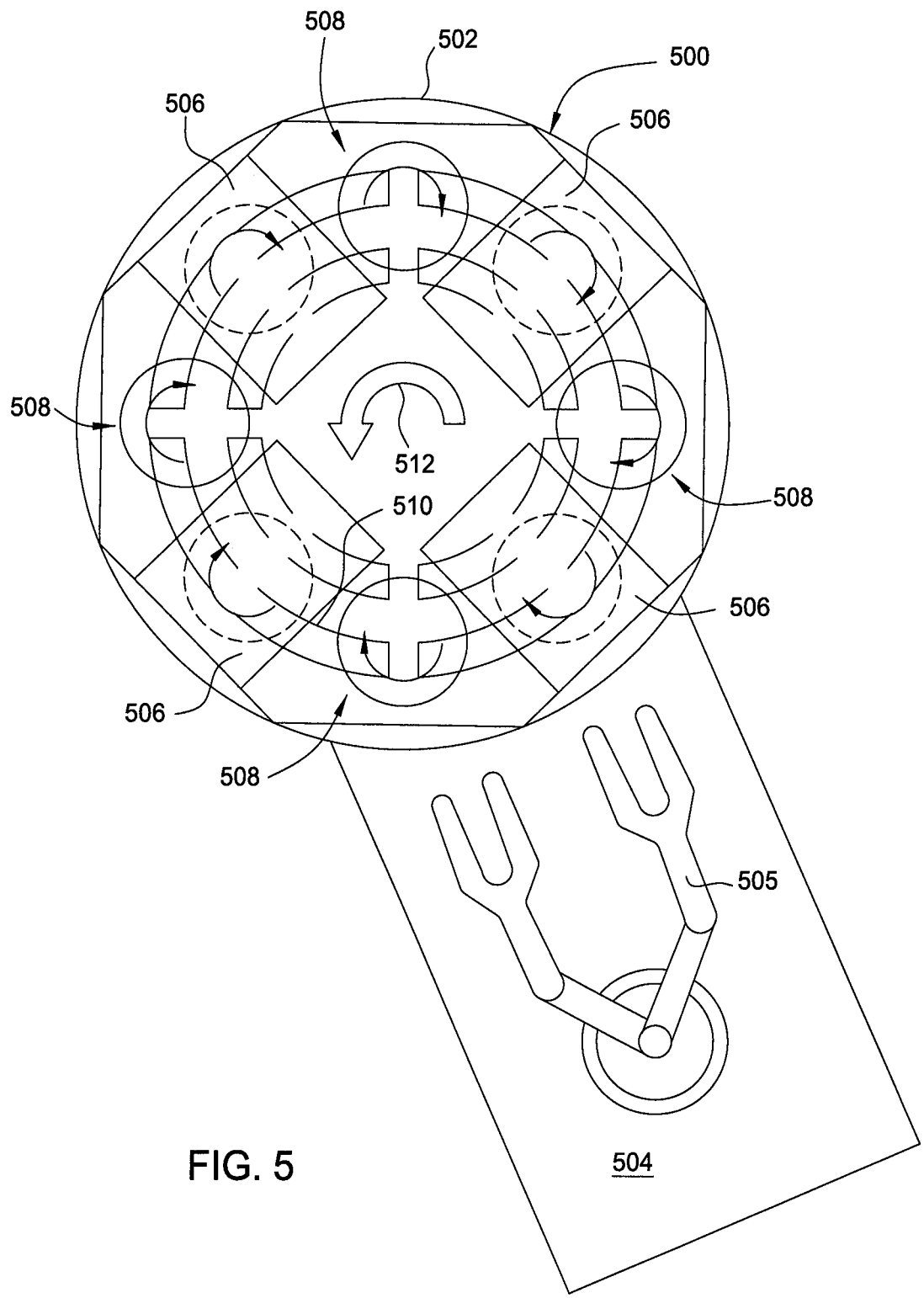
FIG. 5 illustrates a multi-chamber processing system, according to one embodiment.

FIG. 5 illustrates a schematic view of a substrate processing system 500, according to one embodiment. The processing system 500 includes a processing platform 502 having a plurality of processing chambers 506. The processing platform 502 is coupled to a transfer chamber 504. The transfer chamber 504 includes a dual blade robot 505 disposed therein, configured to transfer two substrates (not shown) in and out of the processing platform 502. Optionally, multiple buffer stations 508 are disposed in-between the processing chambers 506 for spatially separating each processing chamber 506 and/or conducting substrate heating or curing.

As shown in FIG. 5, a plurality of substrates can be rotationally disposed in the processing chambers 506. During substrate processing, a rotary track mechanism 510 is configured to rotate in a horizontal direction 512 (e.g., clockwise or counterclockwise) at a first rotating speed such that the plurality of substrates are rotated under and passed through each of the processing chambers 506 and the buffer stations 508.

The processing chambers 506 may be any one of the processing chambers 100, 200, 300, or 400 configured to deposit a precursor to the substrates. The processing chamber 506 may also include a pre-clean processing chamber to remove native oxides, contaminants, or both from exposed surfaces of the substrate, a post-deposition treatment chamber, and a deposition chamber to form a structure on the surface of the substrate.

While the foregoing is directed to embodiments of the present disclosure, other and further embodiments of the disclosure may be devised without departing from the basic scope thereof, and the scope thereof is determined by the claims that follow.

What is claimed is:

1. A processing chamber, comprising:
   a chamber body and a lid, the chamber body and the lid defining an interior volume of the processing chamber, the lid supporting a housing, the housing comprising:
     a vaporizer;
     an internal heat shield spaced from the chamber body, the internal heat shield surrounding the vaporizer and the internal heat shield surrounding an outlet port of the vaporizer;
     a heater disposed adjacent to the vaporizer; and
     a first actuator coupled to the vaporizer and the internal heat shield, the first actuator operable to move the vaporizer and the internal heat shield to a position that encloses a surface of a substrate support disposed in the interior volume of the processing chamber, the enclosed surface and the internal heat shield forming a processing region that is open to the outlet port of the vaporizer.

2. The processing chamber of claim 1, wherein the chamber body comprises:
   temperature controlled walls; and
   a temperature controlled lid.

3. The processing chamber of claim 2, wherein the housing further comprises a cap.

4. The processing chamber of claim 1, wherein the internal heat shield is heated.

5. The processing chamber of claim 4 further comprising:
   a second actuator operable to move the substrate support towards the lid.

6. The processing chamber of claim 1, wherein the outlet of the vaporizer comprises a plurality of openings.

7. The processing chamber of claim 1, further comprising:
   an exhaust port positioned at a first side of a centerline of the substrate support, and wherein the vaporizer is disposed on a second side of the centerline of the substrate support.

8. The processing chamber of claim 1, wherein the heater is selected from the group consisting of a resistive heater, halogen lamps, light emitting diodes, lasers, and flash lamps.

9. A processing chamber, comprising:
   a chamber body and a lid, the chamber body and the lid defining an interior volume of the processing chamber, the lid supporting a housing, the housing comprising:
     a vaporizer;
     an internal heat shield spaced from the chamber body, the internal heat shield surrounding the vaporizer and the internal heat shield surrounding an outlet port of the vaporizer;
     a first thermal isolator coupled to the vaporizer;
     a second thermal isolator coupled to the internal heat shield;
     a heater disposed adjacent to the vaporizer; and
     a first actuator coupled to the vaporizer and the internal heat shield, the first actuator operable to move the vaporizer and the internal heat shield to a position that encloses a surface of a substrate support disposed in the interior volume of the processing chamber, the enclosed surface and the internal heat shield forming a processing region that is open to the outlet port of the vaporizer.

10. The processing chamber of claim 9, wherein the chamber body comprises:
    temperature controlled walls; and
    a temperature controlled lid.

11. The processing chamber of claim 9, wherein the internal heat shield is heated.

12. The processing chamber of claim 9, wherein the vaporizer includes a plurality of openings.

13. The processing chamber of claim 9, further comprising:
    an exhaust port positioned at a first side of a centerline of the substrate support, and wherein the vaporizer is disposed at a second side of the centerline of the substrate support.

14. A substrate processing platform for processing a plurality of substrates, the substrate processing platform comprising:
    a rotary track mechanism;
    a plurality of processing chambers disposed in an array about the rotary track mechanism, wherein one of the processing chambers further comprises:
      a chamber body and a lid, the chamber body and the lid defining an interior volume of the processing chamber, the lid supporting a housing, the housing comprising:
        a vaporizer;
        an internal heat shield spaced from the chamber body, the internal heat shield surrounding the vaporizer and the internal heat shield surrounding an outlet port of the vaporizer;
        a heater disposed adjacent to the vaporizer; and
        a first actuator coupled to the vaporizer and the internal heat shield, the first actuator operable to move the vaporizer and the internal heat shield to a position that encloses a surface of a substrate support disposed in the interior volume of the processing chamber, the enclosed surface and the internal heat shield forming a processing region that is open to the outlet port of the vaporizer; and
    a transfer robot configured to carry a plurality of substrates and concurrently transfer the substrates into and out of the substrate processing platform.

15. The substrate processing platform of claim 14, wherein the processing chamber further comprises:
    water cooled walls; and
    a water cooled lid.

16. The substrate processing platform of claim 14, wherein the internal heat shield is heated.

17. The substrate processing platform of claim 16, wherein the processing chamber further comprises:

a second actuator operable to move the substrate support towards the lid.

18. The substrate processing platform of claim 14, wherein the vaporizer includes a plurality of openings.

19. The substrate processing platform of claim 14, wherein the processing chamber further comprises:
an exhaust port positioned at a first side of a centerline of the substrate support, and wherein the vaporizer is disposed at a second side of the centerline of the substrate support.

* * * * *